US008883582B2

(12) United States Patent
Frohberg et al.

(10) Patent No.: US 8,883,582 B2
(45) Date of Patent: Nov. 11, 2014

(54) HIGH-K GATE ELECTRODE STRUCTURE FORMED AFTER TRANSISTOR FABRICATION BY USING A SPACER

(71) Applicant: Advanced Micro Devices, Inc., Sunnyvale, CA (US)

(72) Inventors: Kai Frohberg, Niederau (DE); Uwe Griebenow, Markkleeberg (DE); Katrin Reiche, Goltzscha (DE); Heike Berthold, Hirschfeld (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/898,392

(22) Filed: May 20, 2013

(65) Prior Publication Data

US 2013/0252409 A1 Sep. 26, 2013

Related U.S. Application Data (62) Division of application No. 12/625,222, filed on Nov. 24, 2009, now Pat. No. 8,470,661.

(30) Foreign Application Priority Data

Nov. 28, 2008 (DE) .......................... 10 2008 059 648

(51) Int. Cl.
| | | |
|---|---|---|
| H01L 21/8238 | (2006.01) | |
| H01L 21/338 | (2006.01) | |
| H01L 21/28 | (2006.01) | |
| H01L 29/78 | (2006.01) | |
| H01L 29/66 | (2006.01) | |
| H01L 29/49 | (2006.01) | |
| H01L 29/51 | (2006.01) | |

(52) U.S. Cl.
CPC ......... *H01L 29/66477* (2013.01); *H01L 29/665* (2013.01); *H01L 29/495* (2013.01); *H01L 21/28114* (2013.01); *H01L 29/7833* (2013.01); *H01L 29/517* (2013.01); *H01L 29/66772* (2013.01); *H01L 21/823857* (2013.01); *H01L 29/6659* (2013.01); *H01L 29/66545* (2013.01)
USPC .................. 438/183; 438/230; 257/E21.444; 257/E21.453

(58) Field of Classification Search
USPC ............ 438/183, 230; 257/E21.444, E21.453
See application file for complete search history.

(56) References Cited

U.S. PATENT DOCUMENTS

| | | | |
|---|---|---|---|
| 7,361,565 B2 | 4/2008 | Shin et al. | |
| 8,470,661 B2 * | 6/2013 | Frohberg et al. | ............. 438/230 |
| 2006/0091432 A1 * | 5/2006 | Guha et al. | .................... 257/288 |
| 2010/0133628 A1 | 6/2010 | Frohberg et al. | |

FOREIGN PATENT DOCUMENTS

EP  1 071 125 A2  1/2001

OTHER PUBLICATIONS

Translation of Official Communication from German Patent Office for German Patent Application No. 10 2008 059 648.5-33 dated Aug. 25, 2009.

\* cited by examiner

*Primary Examiner* — Daniel Whalen (57) ABSTRACT

During a replacement gate approach, the inverse tapering of the opening obtained after removal of the polysilicon material may be reduced by depositing a spacer layer and forming corresponding spacer elements on inner sidewalls of the opening. Consequently, the metal-containing gate electrode material and the high-k dielectric material may be deposited with enhanced reliability.

17 Claims, 6 Drawing Sheets

HIGH-K GATE ELECTRODE STRUCTURE FORMED AFTER TRANSISTOR FABRICATION BY USING A SPACER

CO-PENDING APPLICATIONS

The present disclosure is a divisional application of U.S. patent application Ser. No. 12/625,222, entitled HIGH-K GATE ELECTRODE STRUCTURE FORMED AFTER TRANSISTOR FABRICATION BY USING A SPACER, and filed on Nov. 24, 2009, and which claims priority to German Patent Application No. 10 2008 059 648.5, filed on Nov. 28, 2008.

BACKGROUND OF THE INVENTION

1. Field of the Invention

Generally, the present disclosure relates to sophisticated integrated circuits including transistor elements comprising highly capacitive gate structures on the basis of a metal-containing electrode material and a high-k gate dielectric of increased permittivity compared to conventional gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode, to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with thermal design power requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Therefore, it has been suggested to replace silicon dioxide with high permittivity materials such as tantalum oxide ($Ta_2O_5$) with a k of approximately 25, strontium titanium oxide ($SrTiO_3$) having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone. Since, typically, a low threshold voltage of the transistor, which represents the voltage at which a conductive channel forms in the channel region, is desired to obtain the high drive currents, the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll-off, and also reducing significant variations of transistor performance with a variation in gate length. Since the threshold voltage of the transistors is significantly determined by the work function of the metal-containing gate material, an appropriate adjustment of the effective work function with respect to the conductivity type of the transistor under consideration has to be guaranteed.

After forming sophisticated gate structures including a high-k dielectric and a metalbased gate material, however, high temperature treatments may be required, which may result in a reduction of the permittivity of the gate dielectric caused by an increase of the oxygen contents in the high-k material, thereby also resulting in an increase of layer thickness. Furthermore, a shift of the work function may be observed which is believed to be associated with the enhanced oxygen affinity of many high-k dielectric materials, resulting in a redistribution of oxygen from trench isolation structure via the high-k dielectric material of shared gate line structures, in particular at the moderately high temperatures required for completing the transistors after forming the high-k metal gate structure. Due to this Fermi level shift in the metal-containing gate materials, the resulting threshold voltage may become too high to enable the use of halo implantation techniques for adjusting the transistor characteristics with respect to controlling threshold voltage roll-off to allow high drive current values at moderately low threshold voltages.

The moderate and high temperatures during the transistor fabrication process may be avoided by using an integration scheme, in which the gate electrode structure is formed according to conventional techniques and is finally replaced by a sophisticated high-k metal gate structure, wherein the respective metals are appropriately selected so as to have suitable work functions for N-channel transistors and P-channel transistors, respectively. Thus, in this integration scheme, the conventional polysilicon/oxide gate structure is removed and replaced by the high-k metal stack after the final high temperature anneal processes and the silicidation of the drain and source regions. Hence, the high-k metal gate electrode structure may only experience low temperatures used in the back-end processing, that is, temperatures of approximately 400° C., thereby substantially avoiding the above-described problems with respect to altering the characteristics of the high-k material and shifting the work functions of the metals in the gate electrodes.

Consequently, the replacement of the polysilicon/silicon dioxide gate electrode structure in a very advanced manufacturing stage of the transistor, i.e., after any high temperature processes, is a very promising approach for fabricating transistor elements with enhanced gate electrode structures. Due to these advantages, however, a certain degree of defects may be observed in sophisticated applications, as will be described in more detail with reference to FIGS. 1a-1c.

Figure 1A:
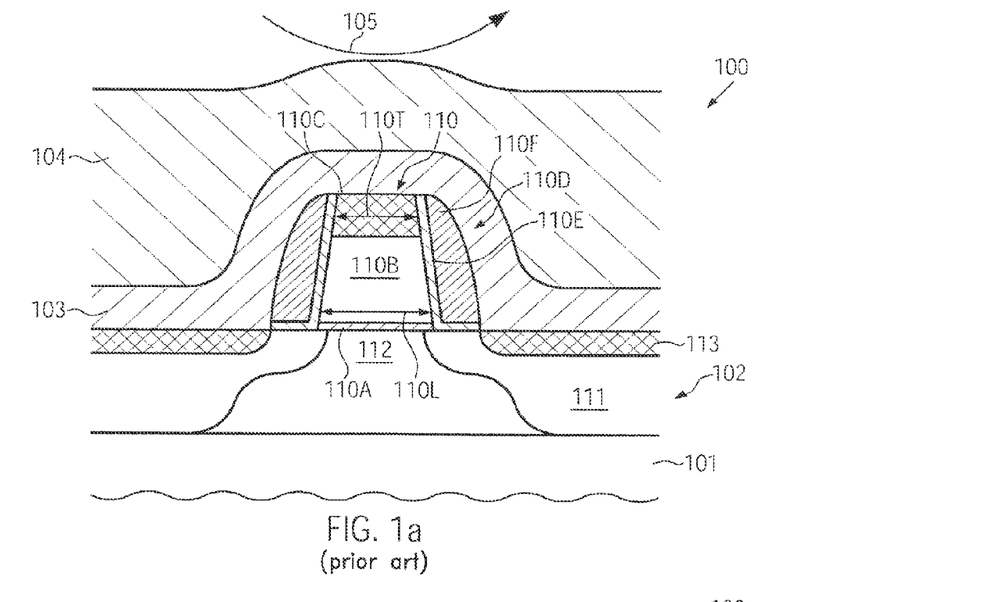
FIGS. 1a-1c schematically illustrate cross-sectional views of a transistor element during various manufacturing stages when forming a sophisticated gate electrode structure by replacing the polysilicon material and the silicon dioxide material in a very advanced manufacturing stage on the basis of conventional process strategies.

FIG. 1a schematically illustrates a semiconductor device 100 in the form of a transistor element in an advanced manufacturing stage. As previously explained, the transistor 100 may comprise drain and source regions 111 formed in a corresponding portion of a semiconductor layer 102. The semiconductor layer 102 may be a part of a substantially crystalline material of a substrate 101, typically a silicon substrate, or the semiconductor layer 102 may be formed on a buried insulating layer (not shown), when an SOI configuration is considered. Moreover, above a channel region 112, a gate electrode structure 110 is formed, which is to be understood as a placeholder structure since essential portions thereof are to be removed in a later manufacturing stage. As illustrated, the gate electrode structure 110 typically comprises a gate dielectric material 110A formed on the channel region 112 and typically comprised of silicon dioxide, which may have a thickness that is appropriate for acting as a gate dielectric material in other device regions in which less critical performance requirements may have to be met. For example, the gate dielectric material 110A may represent a silicon dioxide layer with a thickness of 2 nm and more. Furthermore, a polysilicon material 110B is formed on the gate dielectric layer 110A in accordance with well-established device architecture. Additionally, due to the advanced manufacturing stage of the device 100, metal silicide material 110C is typically formed in an upper portion of the polysilicon material 110B, and corresponding metal silicide regions 113 may also be provided in the drain and source regions. The gate electrode structure 110 may further comprise a spacer structure 110D, for instance in the form of an etch stop liner 110E and a spacer element 110F, which are typically comprised of silicon dioxide and silicon nitride, respectively. Furthermore, a first dielectric layer 103, for instance in the form of a silicon nitride material and the like, is typically formed above the gate electrode structure 110 and the drain and source regions 111, wherein a more or less pronounced internal stress level may be provided in the layer 103, depending on the overall process strategy. As is well known, inducing a specific strain component in the channel region 112 may result in a corresponding lattice distortion, which in turn may modify the charge carrier mobility therein. By applying the layer 103 with a moderately high internal stress level, a desired type of strain may therefore be created in the channel region 112, if desired. Moreover, an interlayer dielectric material 104 in the form of silicon dioxide is formed above the layer 103.

Typically, the semiconductor device 100 is formed on the basis of the following process strategy. After defining corresponding active regions (not shown) in the semiconductor layer 102, a basic dopant profile may be established, for instance by implantation techniques, thereby defining the conductivity of corresponding transistor elements. Thereafter, the material of the gate dielectric layer 110A and the gate electrode material 110B may be formed, for instance, by performing well-established oxidation processes and the like, followed by the deposition of the polysilicon material on the basis of well-established low pressure chemical vapor deposition (CVD) techniques. Thereafter, sophisticated lithography and etch processes may be performed in order to provide an appropriate etch mask that substantially determines the lateral dimension of the gate electrode structure 110, i.e., of the corresponding polysilicon material. During the complex patterning process, a process inherent profile of the gate electrode material 110B may be generated due to the nature of the corresponding etch processes, which may result in a certain degree of corner rounding and the like of the etch mask, thereby also creating a tapering of the polysilicon material. In sophisticated applications in which a gate length of 50 nm and less is to be established, the corresponding degree of tapering may result in a variation of gate length from top to bottom, as indicated by 110T and 110L, respectively. For example, for an effective gate length, i.e., the length 110L, of approximately 45 nm, the corresponding gate length at the top of the structure 110, i.e., the length 110T, may be less by approximately 25% and even more for a typical gate height of approximately 80-100 nm, as may be required for obtaining the desired ion blocking effect of the gate electrode structure 110. A corresponding pronounced degree of tapering may, however, have a negative effect in a later manufacturing stage when the materials 110A, 110B, in combination with metal silicide material 110C, are to be replaced by a high-k dielectric material and a metal-containing gate electrode material.

After patterning the polysilicon material, the further processing may be continued by forming appropriate offset spacers and incorporating dopant species as required for establishing a desired dopant profile connecting to the channel region 112. Furthermore, further implantation processes may be performed on the basis of a more or less advanced stage of the spacer structure 110D, thereby finally obtaining the overall dopant profile for the drain and source regions 111. Thereafter, any final high temperature processes may be performed, for instance for activating dopants and re-crystallizing implantation-induced damage. Consequently, during the entire process sequence, the well-known and well-established characteristics of the polysilicon material 110B in combination with the silicon dioxide based gate dielectric material 110A may provide a reliable process sequence. Thereafter, the dielectric material 103 is deposited, for instance, by plasma enhanced CVD techniques, followed by the deposition of the material 104, for instance in the form of a silicon dioxide material. Next, a chemical mechanical polishing (CMP) process 105 is typically performed in order to remove material of the layers 104, 103 thereby exposing the gate electrode structure 110.

Figure 1B:
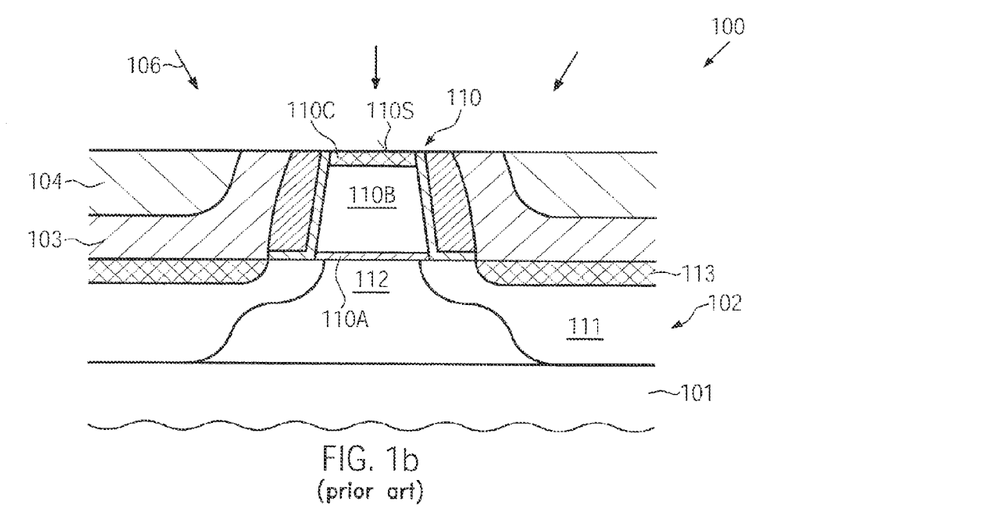

FIG. 1b schematically illustrates the transistor 100 in a further advanced manufacturing stage. As illustrated, a top surface 110S of the gate electrode structure 110 is exposed, for instance by the previously performed planarization process 105 (FIG. 1a), thereby also removing a portion of the metal silicide material 110C. Next, the gate electrode material 110B and the residue of metal silicide material 110C are removed, for instance on the basis of a wet chemical etch process 106, which may be performed on the basis of an etch chemistry having a high selectivity between silicon material and silicon dioxide and silicon nitride. For example, a plurality of appropriate wet chemical etch chemistries are available, such as TMAH (tetra methyl ammonium hydroxide) which may be used at an elevated temperature of approximately 50-80° C. In this case, TMAH, when provided in higher concentrations, has an excellent selectivity with respect to silicon dioxide and silicon nitride while efficiently removing silicon material. Consequently, after etching through the remaining portion of the metal silicide region 110C, the polysilicon material 110B may be efficiently removed. Thereafter, a further etch process is typically applied in order to remove the silicon dioxide based gate dielectric material 110A, which may be accomplished on the basis of hydrofluoric acid and the like. Consequently, after removing the materials 110B and 110A, a high-k dielectric material in combination with a metal-containing electrode material may be deposited in order to obtain the gate electrode structure 110 with enhanced performance.

Figure 1C:
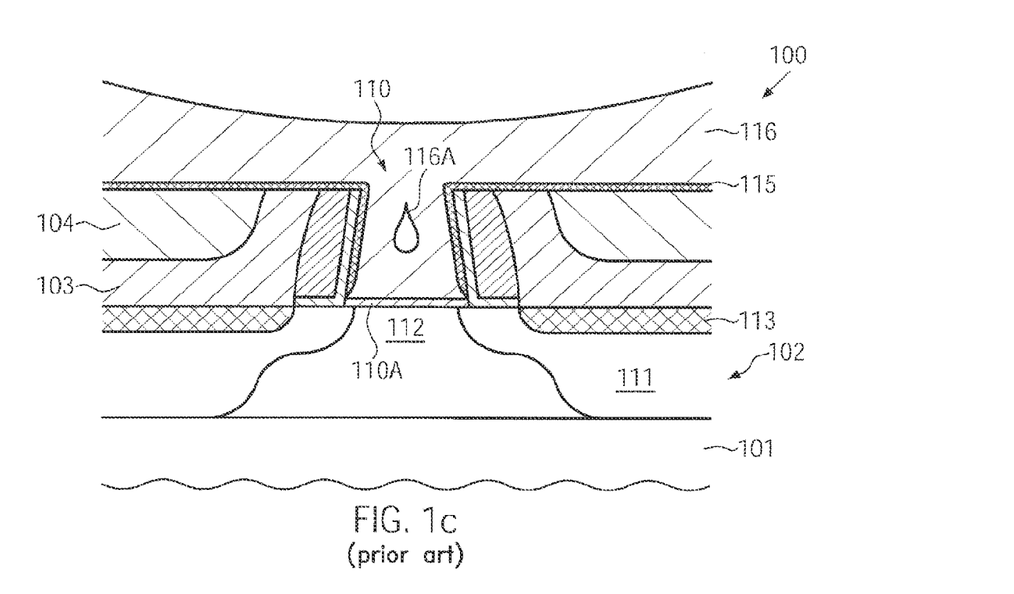

FIG. 1c schematically illustrates the device 100 during a process sequence in which a high-k dielectric material 115, for instance hafnium oxide and the like, is deposited with a desired thickness, for instance 10-25 Å in sophisticated applications, followed by the deposition of a metal-containing electrode material 116, for instance in the form of titanium nitride and the like. In particular, during the deposition of the metal-containing material 116, the inverse tapering of the opening formed during the removal of the gate electrode material 110B (FIG. 1b) may result in deposition-related non-uniformities, for instance in the form of voids 116A and the like, which may result in reduced reliability and in a complete gate failure, thereby contributing to increased yield losses.

Consequently, although the replacement of a conventional gate electrode structure by sophisticated high-k dielectrics and metal-containing electrode materials in a very advanced manufacturing stage may be advantageous in view of reliability of the high-k dielectric material and the gate electrode material, the tapering of the previously formed polysilicon placeholder material may contribute to a significant reliability issue, so that the conventional strategy described above is less desirable.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods for forming the same in which a portion of the gate electrode structure may be replaced by sophisticated materials in an advanced manufacturing stage, while deposition-related irregularities may be substantially avoided or at least significantly reduced by reducing the degree of tapering in an opening that is created in a dielectric material after the removal of the placeholder structure. To this end, a material layer may be deposited and may be subsequently anisotropically etched prior to depositing the metal-containing electrode material, thereby enhancing the deposition condition by significantly reducing the degree of inverse tapering in the corresponding opening. In some illustrative embodiments disclosed herein, the deposition and the subsequent anisotropic etching may result in a "sidewall spacer" in the opening, the thickness of which may increase with increasing depth within the opening, thereby reducing the degree of tapering. Consequently, the subsequent deposition of the metal-containing electrode material may be accomplished on the basis of less restrictive deposition conditions, thereby enabling a reliable filling of the corresponding opening. In other illustrative aspects disclosed herein, the tapering of the resulting opening may be relaxed on the basis of the metal-containing gate electrode material itself, wherein a first portion thereof may be deposited and may be subsequently anisotropically etched, followed by one or more further deposition and etch cycles so that a corresponding "conductive sidewall spacer" may be formed for enhancing the deposition conditions for a final deposition step for completely filling the resulting opening.

One illustrative method disclosed herein comprises removing a first gate electrode material from a gate electrode structure of a transistor that is laterally embedded in a dielectric material. The method further comprises forming a sidewall spacer in an opening formed in the dielectric material by removing the first gate electrode material. Finally, the method comprises forming a second gate electrode material on a high-k dielectric layer that is formed at least at the bottom of the opening.

A further illustrative method disclosed herein comprises removing a placeholder material of a gate electrode structure of a transistor by forming an opening in a dielectric material. Moreover, the method comprises depositing a first material layer in the opening and performing an anisotropic etch process to remove a portion of the first material layer. Additionally, the method comprises depositing a second material layer to fill the opening, wherein the second material comprises a metal-containing gate electrode material.

One illustrative semiconductor device disclosed herein comprises a high-k dielectric layer formed above a channel region of a transistor. Moreover, the semiconductor device comprises a metal-containing electrode material formed on the high-k dielectric layer and having a top surface. The metal-containing electrode material has a first length at an interface with the high-k dielectric material and has a second length at the top surface, wherein the first length is approximately 50 nm or less and wherein the second length is less than the first length by approximately 15% of the first length or less.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides enhanced techniques and devices wherein sophisticated high-k dielectric metal gate stacks may be formed after completing the basic transistor structures and after forming a portion of an interlayer dielectric material, thereby ensuring a high degree of compatibility with well-established CMOS integration regimes. Additionally, enhanced gate integrity may be accomplished by improving the tapering, i.e., reducing the degree of tapering of an opening after the removal of the placeholder material, such as the polysilicon material, by depositing at least one material layer and performing an anisotropic etch process so as to obtain a "sidewall spacer" element having an increased width at the bottom of the opening so that a significant reduction of the inverse tapering may be accomplished. Consequently, well-established regimes for patterning polysilicon-based gate electrodes may be used without causing significant yield losses, as may be the case for conventional process strategies. The reduction of degree of inverse tapering may be accomplished by providing a well-established dielectric material, such as silicon nitride, which may be deposited in a highly conformal manner, for instance so as to not close the corresponding opening after the removal of the polysilicon material so that a subsequent anisotropic etch process may result in a "narrowing" of the corresponding opening at the bottom thereof. Consequently, during the subsequent deposition of the high-k dielectric material and the metal-containing electrode material, the probability of creating deposition-related irregularities may be significantly reduced. In some illustrative embodiments, the silicon-based gate dielectric may be maintained during the anisotropic etch process so, without any additional deposition steps, enhanced etch stop capabilities may be provided during the patterning of the "spacer element," while, in other cases, a dedicated etch stop material may be deposited first, followed by deposition of the spacer material. In still other illustrative embodiments, the spacer material may be removed selectively to the channel region. In still other illustrative embodiments, enhanced etch stop capabilities may be accomplished during the reduction of the degree of inverse tapering by providing a high-k dielectric material prior to the deposition of the spacer material, for instance in the form of hafnium oxide, which may exhibit excellent etch stop capabilities.

In other illustrative embodiments disclosed herein, the reduction of inverse tapering may be accomplished on the basis of the electrode material itself by performing at least one intermediate anisotropic etch process, thereby creating a corresponding "spacer element" prior to performing a further deposition step in order to finally completely fill the corresponding opening. In this manufacturing sequence, the enhanced etch stop capabilities of the high-k dielectric material may be taken advantage of. Consequently, the initial gate length, i.e., the length of the electrode material at the bottom of the gate electrode structure, may be substantially maintained while nevertheless significantly reducing the probability of creating deposition-related irregularities.

With reference to FIGS. 2a-2g, further illustrative embodiments will now be described in more detail, wherein reference may also be made to FIGS. 1a-1c, if required.

Figure 2A:
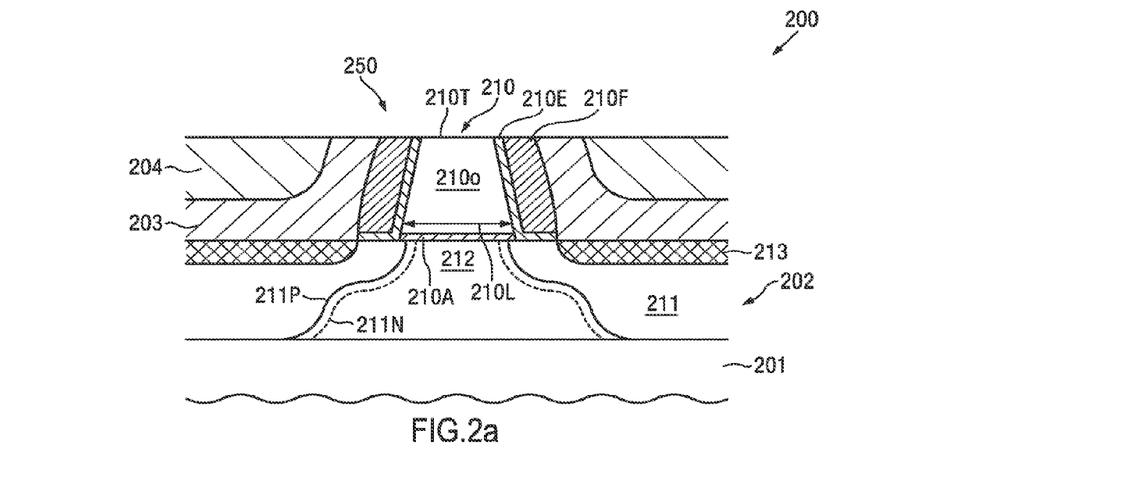
FIGS. 2a-2e schematically illustrate cross-sectional views of a semiconductor device during various manufacturing stages in which a sophisticated gate electrode may be formed on the basis of a high-k dielectric material and a metal-containing electrode material in an advanced manufacturing stage by improving the degree of tapering in a corresponding opening prior to actually filling the opening with the metal-containing electrode material, according to illustrative embodiments.

FIG. 2a schematically illustrates a semiconductor device 200 comprising a substrate 201 above which may be formed a semiconductor layer 202. For example, the substrate 201 and the layer 202 may represent a bulk configuration, i.e., the substrate 201 and the layer 202 may represent a crystalline semiconductor material or at least the layer 202 may have a thickness that is significantly greater than a corresponding vertical extension of respective drain and source regions 211 formed in the semiconductor layer 202. In other cases, an SOI configuration may be provided, at least locally within the semiconductor device 200, as is also previously discussed with reference to the device 100. Furthermore, in the manufacturing stage shown, a gate electrode structure 210 of a transistor 250 may be partially removed, thereby forming an opening 210o that is embedded in a dielectric material. For example, the gate electrode structure 210 may comprise a liner material 210E in combination with a spacer element 210F, which may be provided in the form of a silicon dioxide material and a silicon nitride material, as is also previously explained with reference to the device 100. Furthermore, interlayer dielectric materials 203 and 204, for instance in the form of silicon nitride, nitrogen-containing silicon carbide, silicon dioxide and the like, may be provided so as to laterally enclose the gate electrode structure 210. Moreover, due to the advanced manufacturing stage, corresponding metal silicide regions 213 may be formed in the drain and source regions 211.

The semiconductor device 200 may be formed on the basis of similar process techniques as previously described with reference to the device 100. Consequently, during the manufacturing sequence for forming the gate electrode structure 210, a corresponding degree of tapering may be created, as previously explained. Hence, the corresponding opening 210o may also exhibit the corresponding tapering, which may also be referred to as an inverse or negative tapering. Consequently, a first length 210L at the bottom of the opening 210o may be 50 nm and less for highly sophisticated applications, while, on the other hand, a second length 210T taken at the top of the opening 210o may be significantly reduced, for instance by approximately 20% or more relative to the first length 210L. For example, for a design value of the effective gate length 210L of 45 nm, the second length 210T may be in the range of approximately 35 nm or even less. Consequently, by reducing the degree of inverse tapering, any deposition-related irregularities in filling the opening 210o may be significantly reduced. To this end, a corresponding "spacer element" may be formed to reduce the first length 210L substantially without affecting the second length 210T. It should be appreciated that, in some illustrative embodiments, a corresponding reduction of the lengths 210L, 210T may be accomplished on the basis of a dielectric material, which may result in a corresponding reduction of the effective channel length. In this case, the position of the PN junctions 211P, formed on the basis of the initial length 210L, may be considered inappropriate in order to obtain the desired transistor performance after reducing the effective gate length 210L. Hence, according to some illustrative embodiments, the preceding manufacturing sequence may be modified with respect to forming the drain and source regions 211, for instance by appropriately adapting the process parameters of anneal processes in order to provide an increased thermal diffusion, thereby driving the PN junctions farther into the channel region 212, as indicated by the dashed line 211N. In still other illustrative embodiments, in addition to or alternatively to appropriately adapting the anneal parameters, corresponding parameters of an implantation sequence may be modified, for instance with respect to using a tilt angle and the like, in order to appropriately position the PN junctions 211N with respect to the final effective channel length still to be adjusted.

In other illustrative embodiments, the initial length 210L may be substantially maintained while nevertheless providing enhanced deposition conditions. In this case, a corresponding adaptation of the PN junction 211P may not be necessary.

Figure 2B:
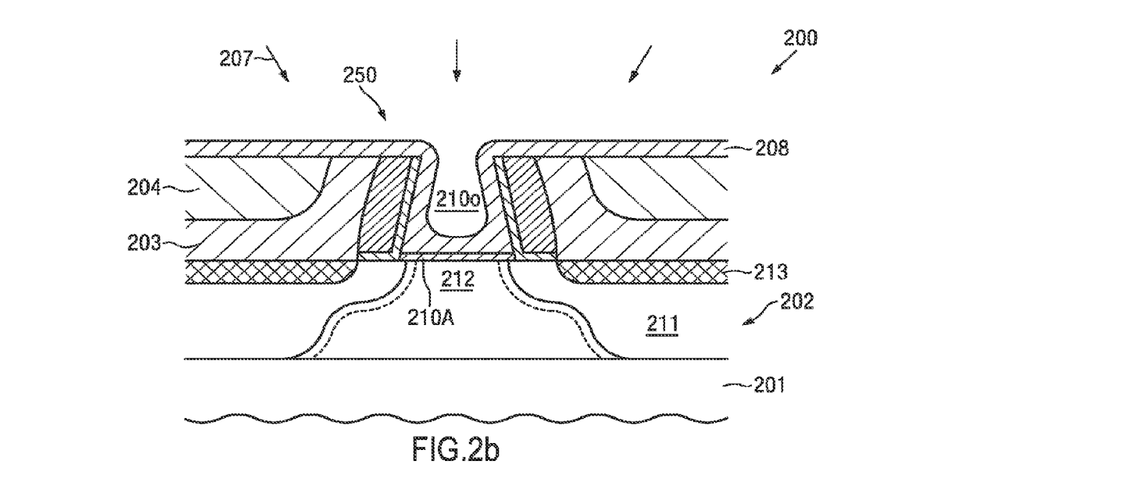

FIG. 2b schematically illustrates the device 200 in an advanced manufacturing stage. As illustrated, the device 200 may be exposed to a deposition ambient 207 in order to deposit a spacer layer 208 within the opening 210o without, however, not completely closing the opening 210o. In the embodiment shown, a gate dielectric layer 210a of the initial gate electrode structure 210 may be maintained during the removal of a corresponding polysilicon material in order to act as an etch stop material during the further processing when anisotropically etching the spacer layer 208. Consequently, enhanced integrity of the channel region 212 may be maintained throughout the subsequent process steps. The spacer layer 208 may be comprised of any appropriate dielectric material, such as silicon nitride, silicon dioxide and the like, when compatible with the further processing of the device. For example, the spacer layer 208 may be provided with an appropriate thickness of approximately 3-10 nm when measured at horizontal device portions. Consequently, a significant deposition of material may also be accomplished along the sidewalls of the opening 210o. For this purpose, well-established deposition techniques, as may also be used for other spacer formation processes, may be applied, for instance thermally activated CVD techniques when corresponding temperatures are compatible with the state of the device 200, while in other cases plasma enhanced CVD techniques and the like may be used.

Figure 2C:
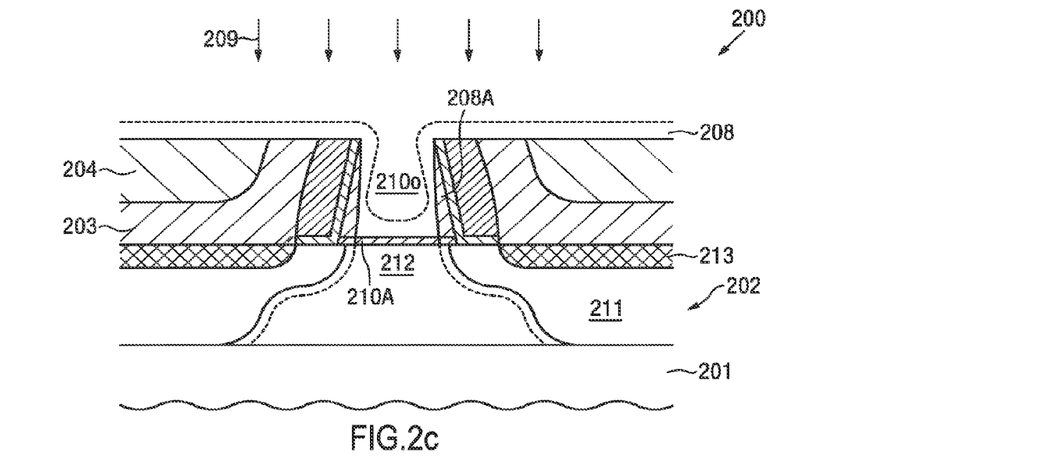

FIG. 2c schematically illustrates the semiconductor device 200 in a further advanced manufacturing stage in which an anisotropic etch process 209 may be performed, for instance on the basis of well-established etch chemistries, which may also be used in spacer patterning sequences. For example, the anisotropic etch process 209 may be performed on the basis of etch chemistry that has a high degree of selectivity with respect to silicon dioxide material so that the remaining gate dielectric layer 210A may act as an efficient etch stop material, while increasingly material of the layer 208 may be removed. Due to the anisotropic nature of the process 209, finally a corresponding spacer element 208A may be generated, thereby reducing the width at the bottom of the opening 210o due to the increasing width of the spacer 208A.

Figure 2D:
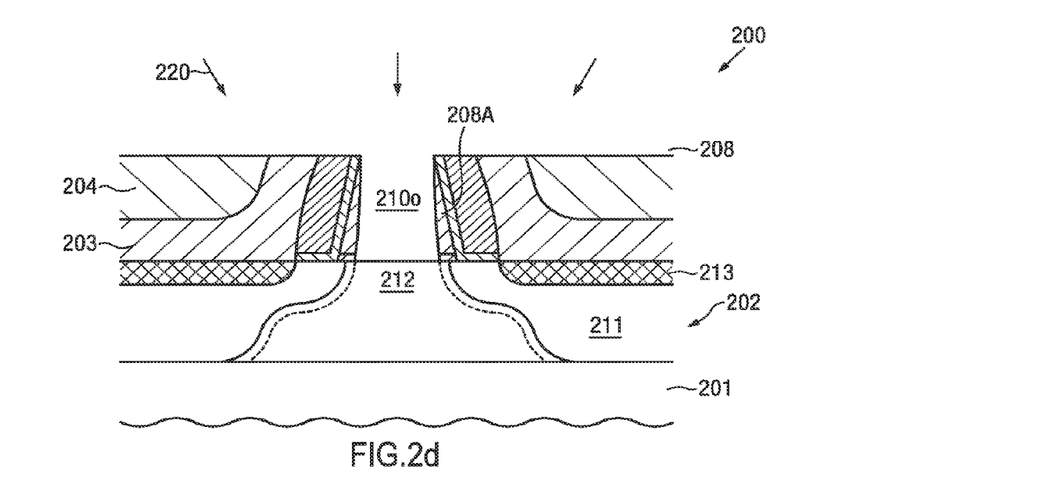

FIG. 2d schematically illustrates the semiconductor device 200 when exposed to a further etch ambient 220 that is designed to remove the etch stop material from the bottom of the opening 210o, thereby exposing the channel region 212. In the above-mentioned embodiment, the previously provided gate dielectric layer 210A (FIG. 2c) may have been used as an etch stop material, which may be selectively removed to the material of the channel region 212 by well-established wet chemical etch techniques, such as hydrofluoric acid and the like. Since the gate dielectric material 210A may be moderately thin, undue material erosion of the channel region 212 may be less critical. In other illustrative embodiments, a dedicated etch stop layer may be deposited, for instance after removing the gate dielectric layer 210A, prior to the deposition of the spacer layer 208 (FIG. 2b), as will be described later on in more detail. Thereafter, further processing may be continued on the basis of well-established process techniques, i.e., by depositing a high-k dielectric material followed by the deposition of a metal-containing electrode material having the desired characteristic with respect to work function and the like in order to comply with the required transistor characteristics of the device 250. Due to the significantly reduced inverse tapering of the opening 210o, enhanced deposition conditions are provided which may result in a significantly reduced probability of creating deposition-related irregularities, as is the case in the conventional process strategy.

Figure 2E:
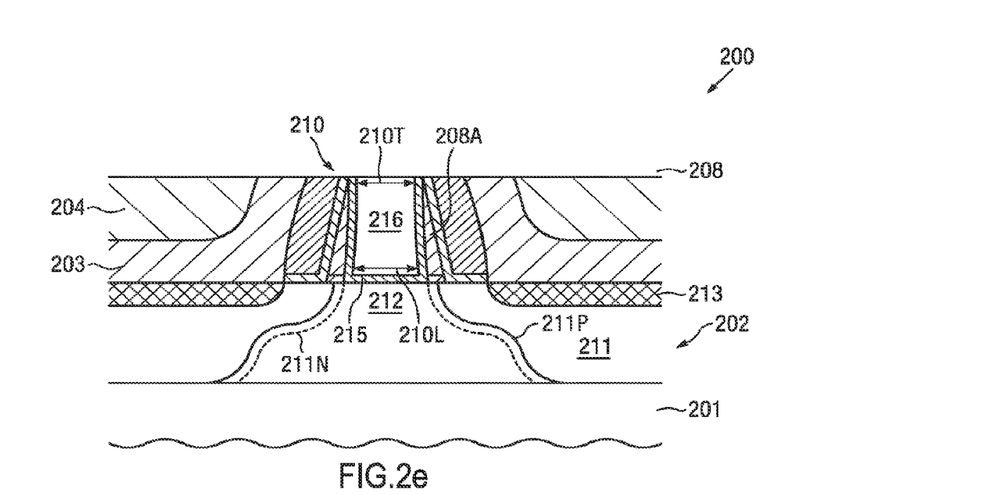

FIG. 2e schematically illustrates the semiconductor device 200 in a further advanced manufacturing stage. As illustrated, the gate electrode structure 210 may comprise a high-k dielectric gate material 215 with an appropriate thickness in accordance with transistor requirements and also a metal-containing electrode material 216, such as titanium nitride and the like, may be formed on the high-k dielectric material 215. Furthermore, due to the presence of the dielectric spacer elements 208A, the first length 210L may be reduced compared to the initial length 210L (FIG. 2a) so that a difference between the length 210T and 210L is significantly less pronounced. For example, the second length 210T may, at most, be less than the first length by approximately 15% or less. In other cases, the second length 210T may be less by approximately 10% or less. In still other illustrative embodiments, a difference between the first and second lengths may still be less pronounced than specified above. Furthermore, in some cases, the first length may be less than the second length according to the percentage as specified above. As previously explained, if a significant reduction of the first length 210L may be accomplished by means of the spacer element 208A, and if a corresponding reduction may be considered inappropriate for PN junctions 211P, established on the basis of the initial length, the corresponding process flow may be appropriately adapted so as to obtain the PN junctions 211N. Moreover, in some illustrative embodiments, the formation of the spacer element 208A may be used as a compensation mechanism for appropriately adapting the gate length 210L to the actual channel length, which may vary due to corresponding fluctuations during the patterning of the initial gate electrode structure, such as the structure 110 illustrated in FIG. 1a. This may be accomplished by appropriately selecting an initial thickness of the spacer layer 208 (FIG. 2b).

Consequently, the transistor 250 may be provided with the sophisticated gate electrode structure 210 comprising the metal-containing gate electrode material 216 and the high-k dielectric material 215 substantially without any deposition-related irregularities, while nevertheless maintaining a high degree of compatibility with the conventional process strategies.

Figure 2F:
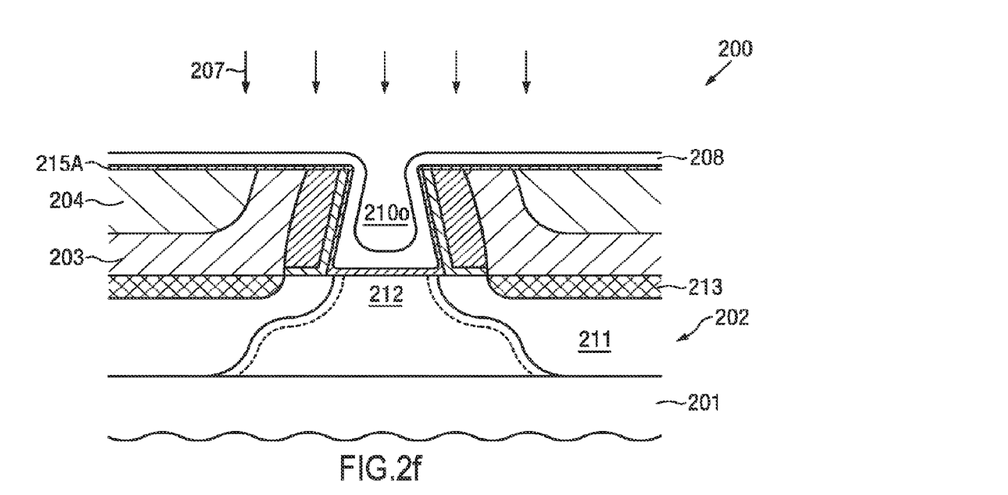
FIGS. 2f-2g schematically illustrate cross-sectional views of the semiconductor device in which the degree of tapering may be reduced, for instance on the basis of a metal-containing material and additionally provided etch stop material and the like, according to still further illustrative embodiments.

FIG. 2f schematically illustrates the semiconductor device 200 according to further illustrative embodiments. In one embodiment, the previous gate dielectric layer 210A (FIG. 2c) may have been removed according to conventional strategies, or may have been maintained (not shown). Furthermore, during the deposition process 207, a dedicated etch stop layer 215A may be formed, followed by the deposition of the spacer layer 208. In some illustrative embodiments, the etch stop material 215A may be provided in the form of a silicon dioxide material by using well-established process techniques. In other illustrative embodiments, the etch stop layer 215A may be comprised of a high-k dielectric material, such as hafnium oxide, which may exhibit superior etch stop capabilities compared to silicon dioxide. Consequently, based on the etch stop layer 215A, the further processing may be continued, as previously described, for instance by performing the anisotropic etch process 209 (FIG. 2c) and removing the etch stop layer 215A, i.e., an exposed portion thereof, after forming the corresponding spacer elements. Thereafter, the further processing may be continued, as previously described.

In other illustrative embodiments, the etch stop layer 215A may be provided in the form of the high-k dielectric material and the spacer layer 208 may be deposited as a metal-containing electrode material, however with an appropriate thickness so as to act as a "spacer layer."

Figure 2G:
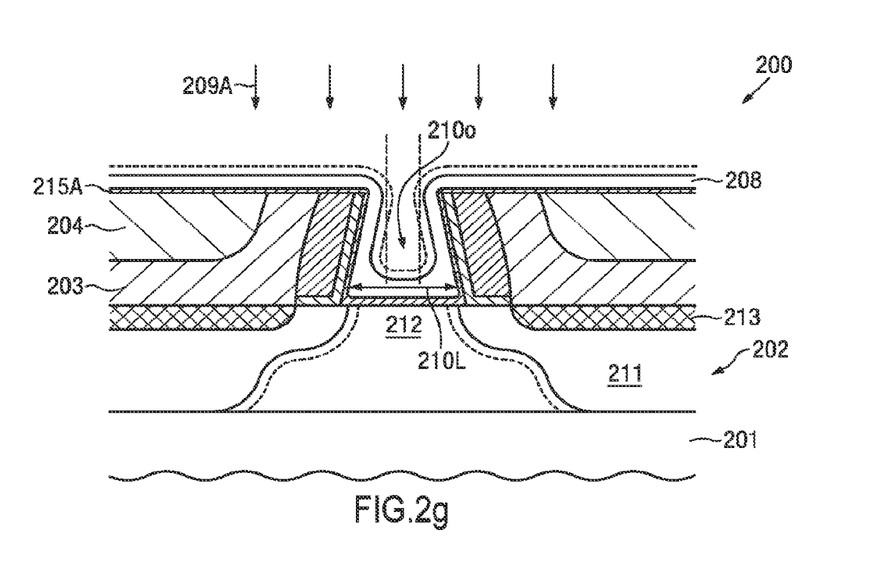

FIG. 2g schematically illustrates a cross-sectional view of the device 200 during an anisotropic etch process 209A that is designed to remove material of the layer 208 selectively to the etch stop layer 215A, i.e., the high-k dielectric material having the superior etch stop capabilities. Consequently, even if a portion of the etch stop material 215A may be exposed at the bottom of the opening 210o during the etch process 209A in order to appropriately reduce the degree of tapering, as previously explained, undue material erosion of the layer 215A may be suppressed. In still other illustrative embodiments, the initial thickness of the layer 208 and the process parameters of the process 209A may be adjusted such that a minimum thickness may be maintained above the layer 215A, so that material erosion may be avoided. Thereafter, a further layer of the metal-containing material may be deposited, for instance in order to substantially completely fill the opening 210o or, in other illustrative embodiments, perform a further anisotropic etch process to further enhance the profile of the resulting opening 210o. Thereafter, one or more additional deposition/etch cycles may be performed and finally the opening 210o may be completely filled with the electrode material 208. Consequently, the initial length 210L may be substantially maintained, except for a minor reduction due to the thickness of the dielectric layer 215A. Thus, respective adaptations of the previous manufacturing flow with respect to reducing the effective channel length may not be necessary.

As a result, the present disclosure provides semiconductor devices and techniques for forming the same in which the deposition conditions for depositing a metal-containing gate electrode material after removal of the polysilicon material may be enhanced by reducing the degree of negative tapering prior to completely filling the corresponding opening. For this purpose, in some illustrative embodiments, a dielectric spacer element may be formed prior to depositing a metal-containing material, while in other cases the electrode material itself may be used as a spacer material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   removing a first gate electrode material from a gate electrode structure of a transistor, said transistor being laterally embedded in a dielectric material;
   forming a sidewall spacer in an opening formed in said dielectric material by removing said first gate electrode material, wherein forming said sidewall spacer comprises depositing a dielectric material layer after removing said first gate electrode material, depositing a spacer material layer comprising a metal-containing material on said dielectric material layer, and anisotropically etching said spacer material layer while using said dielectric material layer as an etch stop; and
   forming a second gate electrode material on a high-k dielectric layer formed at least at a bottom of said opening.

2. The method of claim 1, wherein forming said sidewall spacer in said opening comprises depositing a dielectric material and anisotropically etching said deposited dielectric material.

3. The method of claim 2, wherein said dielectric material layer is deposited so as to not completely close said opening.

4. The method of claim 2, wherein forming said sidewall spacer in said opening further comprises maintaining a gate dielectric layer of said gate electrode structure and using said gate dielectric layer as an etch stop layer when anisotropically etching said dielectric layer.

5. The method of claim 1, wherein said dielectric material layer comprises a high-k dielectric material.

6. The method of claim 1, further comprising depositing a further layer of said metal-containing material.

7. The method of claim 1, further comprising removing a portion of a gate dielectric material of said gate electrode structure in the presence of said sidewall spacer and forming said high-k dielectric layer in said opening.

8. The method of claim 1, wherein said sidewall spacer comprises silicon nitride.

9. The method of claim 1, wherein said first gate electrode material has a length of approximately 50 nm or less at an interface formed with a gate dielectric material of said gate electrode structure.

10. The method of claim 1, wherein said opening formed by removing the first gate electrode material has a top width that is narrower than a bottom width, and the sidewall spacer reduces a difference between the top width and the bottom width of said opening, wherein the top width is less than the bottom width after forming the sidewall spacer.

11. A method, comprising:
    removing a placeholder material of a gate electrode structure of a transistor by forming an opening in a dielectric material;
    forming an etch stop layer in said opening;
    depositing a first material layer in said opening above said etch stop layer;
    performing an anisotropic etch process to remove a portion of said first material layer and expose at least a portion of said etch stop layer;
    depositing a high-k dielectric layer after performing said anisotropic etch process; and
    depositing a second material layer to fill said opening, said second material layer comprising a metal-containing gate electrode material.

12. The method of claim 11, wherein depositing said first material layer comprises depositing a dielectric material.

13. The method of claim 11, wherein said etch stop layer comprises a high-k dielectric material.

14. The method of claim 11, wherein said first material layer is deposited as a metal-containing material.

15. The method of claim 14, further comprising depositing at least one further material layer after performing said anisotropic etch process and performing at least one further anisotropic etch process prior to depositing said second material layer.

16. The method of claim 11, wherein the opening has a top width that is narrower than a bottom width, and a difference between the top width and the bottom width of the opening is reduced during removal of the portion of said first material layer, wherein the top width is less than the bottom width after removal of the portion of said first material layer.

17. A method, comprising:
    removing a placeholder material of a gate electrode structure of a transistor by forming an opening in a dielectric material;
    depositing a first material layer in said opening, wherein said first material layer is deposited as a metal-containing material;
    performing an anisotropic etch process to remove a portion of said first material layer; and
    depositing a second material layer to fill said opening, said second material layer comprising a metal-containing gate electrode material; and
    depositing at least one further material layer after performing said anisotropic etch process and performing at least one further anisotropic etch process prior to depositing said second material layer.

* * * * *